(12) United States Patent
Pyo et al.

(10) Patent No.: US 6,346,478 B1
(45) Date of Patent: Feb. 12, 2002

(54) METHOD OF FORMING A COPPER WIRING IN A SEMICONDUCTOR DEVICE

(75) Inventors: Sung Gyu Pyo, Ichon-shi; Heon Do Kim, Kunpho-shi, both of (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/488,521

(22) Filed: Jan. 21, 2000

(30) Foreign Application Priority Data

Apr. 13, 1999 (KR) .................................. 99-13008

(51) Int. Cl.$^7$ .............................................. H01L 21/44
(52) U.S. Cl. ..................................... 438/687; 438/681
(58) Field of Search .................................. 438/681, 687

(56) References Cited

U.S. PATENT DOCUMENTS

| | | |
|---|---|---|
| 5,767,301 A | 6/1998 | Senzaki et al. |
| 6,037,001 A | * 3/2000 | Kaloyeros et al. .......... 427/250 |
| 6,066,196 A | * 5/2000 | Kaloyeros et al. .......... 106/1.18 |
| 6,090,960 A | * 7/2000 | Senzaki et al. ................ 556/9 |

FOREIGN PATENT DOCUMENTS

| | | |
|---|---|---|
| EP | 0 852 229 A2 | 7/1998 |
| EP | 0 854 507 A2 | 7/1998 |
| EP | 0 855 399 A2 | 7/1998 |

OTHER PUBLICATIONS

Chemical Vapor Deposition of Copper with a New Metalorganic Source, Choi et al., Appl. Phys. Lett. 68(7), Feb. 1996, pp. 1017–1019.

* cited by examiner

Primary Examiner—John F. Niebling
Assistant Examiner—Lynne Gurley
(74) Attorney, Agent, or Firm—Pennie & Edmonds LLP

(57) ABSTRACT

The present invention is related to a copper wiring in a semiconductor device. Also, the invention describes a method of a copper wiring in a semiconductor device that can not only realize repeatability of a copper deposition process, but produce a thin copper film of superior film quality because the present invention can induce perfect surface absorption reaction in copper depositing by setting optimum deposition process conditions of a copper deposition equipment and establishing a MOCVD process technology using 1,1,1,5,5,5-hexafluoro-2,4-pentadionato (vinyltrimethoxysilane)-copper(I) compound as a copper precursor.

81 Claims, 3 Drawing Sheets

METHOD OF FORMING A COPPER WIRING IN A SEMICONDUCTOR DEVICE

BACKGROUND OF THE INVENTION

1. Field of the Invention

The present invention relates to a method of forming a copper wiring in a semiconductor device, and more particularly to a method of forming a copper wiring in a semiconductor device to produce a thin copper film of superior quality as well as to realize repeatability of a copper deposition process by establishing the Metal Organic Chemical Vapor Deposition (MOCVD) process technology using the 1,1,1,5,5,5-hexafluoro-2,4-pentadionato(vinyltrimethoxysilane)-copper(I) {(hfac)Cu(VTMOS)} compound as a copper precursor.

2. Description of the Prior Art

While the semiconductor industry moves to the Ultra Large Scale Integration (ULSI) and the geometry of a device reduces to the sub-half-micron area, circuit density from the aspect of performance improvement and reliability increases. According to such demand, a thin copper film may improve reliability of a semiconductor device because the melting point of the film is higher than a temperature of aluminum and resistance of the film against Electro-Migration (EM) is large. Also, since a thin copper film can increase signal transmission speed as its specific resistance is low, the film is used as an interconnection material that is useful for integration circuits.

In a method of forming a copper wiring, the copper deposition process is an important process for realizing fast devices and high integration devices. Applied technology for copper deposition includes Physical Vapor Deposition (PVD), electroplating, electroless-plating and MOCVD. For copper deposition by MOCVD in the above methods, a copper precursor should be developed for easy deposition because of much influence by a copper precursor. It is also essential to develop a delivery system that can safely deliver a copper precursor for the method.

For copper deposition by MOCVD, such Liquid Delivery Systems (LDS) as the Direct Liquid Injection (DLI) manufactured by "MKS" and the Control Evaporation Mixer (CEM) by "Brongkhorst" are used. Copper deposition by MOCVD is performed by resolving the compound including copper called a precursor in such an LDS. For a copper precursor used in MOCVD, a $Cu^I$ compound, whose deposition speed is rapid compared with a $Cu^{II}$ compound because of high vapor pressure, to allow thin copper film deposition of high purity at a low temperature of 150° C. through 250° C. was developed since such $Cu^{II}$ compound as the 1,1,1,5,5,5-hexafluoro-2,4-pentadionato-copper(II) {(Cu(hfac)$_2$} compound of low vapor pressure was developed. In the $Cu^I$ compounds developed until now, the 1,1,1,5,5,5-hexafluoro-2,4-pentadionato(trimethylvinylsilane)-copper(I) {(hfac)Cu(TMVS)} compound developed by "Schmacher" exists as liquid form at a room temperature, and is a representative precursor for MOCVD used most in the world at present because the compound allows thin copper films of high purity to be deposited at a low temperature. A problem of a (hfac)Cu(TMVS) compound, however, is that it is degraded in storing at a room temperature in spite of such merit. Therefore, the compound has some difficulty in applying to the manufacturing process of a semiconductor device for process repeatability of the compound. It is very difficult to keep repeatability as far as a new LDS for safe delivery is not developed because the vapor pressure of the compound is rather high in the developed precursors but it is rather low to keep repeatability in the existing LDS. Also, another difficulty is that very constant temperature should be kept because the interval between a vaporization temperature and a condensation temperature of a (hfac)Cu(TMVS) compound is very short. "Schmacher" has announced that a (hfac)Cu(TMVS) compound may be used safely for 1 year, using the stabilizer.

To settle the problems of the (hfac)Cu(TMVS) compound, "Up Chemical" developed the (hfac)Cu(VTMOS) compound as a precursor. A (hfac)Cu(VTMOS) compound is known that degradation and deterioration of the compound is not generated at a room temperature, compared with the (hfac)Cu(TMVS) compound, by strengthened binding capability using a methoxy ligand. The (hfac)Cu(VTMOS) compound is also known as a compound of profitable competitive power with cheap price and stability because the compound can also keep process repeatability in applying to the manufacturing process of a semiconductor device. The (hfac)Cu(VTMOS) compound, however, is not yet commercialized because MOCVD process technology to use a (hfac)Cu(VTMOS) precursor in the existing LDS is not established yet.

SUMMARY OF THE INVENTION

Accordingly, the present invention is directed to provide a method of forming a copper wiring in a semiconductor device to produce a thin copper film of superior film quality because not only can the method realize repeatability of the copper deposition process without new LDS development, but can induce perfect surface absorption reaction in copper deposition, by establishing the MOCVD process technology using a (hfac)Cu(VTMOS) compound as a copper precursor after setting optimum deposition process conditions of a copper deposition equipment.

To achieve these and other advantages and in accordance with the purpose of the present invention, the method of forming a copper wiring in a semiconductor device of the present invention is characterized by comprising: a step of providing a copper deposition equipment to consist of a reaction chamber and a liquid delivery system; a step of loading a wafer on the reaction chamber; a step of evaporating a (hfac)Cu(VTMOS) precursor in the liquid delivery system; a step of flowing the evaporated (hfac)Cu(VTMOS) precursor into the reaction chamber; and a step of depositing copper on the wafer by the method of MOCVD.

The liquid delivery system is one of a direct liquid injection, a control evaporation mixer, a system to have a vaporizer of orifice type and a system to have a vaporizer of spray type.

Process condition, when the liquid delivery system is a direct liquid injection, is: to set a temperature of a vaporizer in the direct liquid injection to 70° C. through 120° C.; to control a temperature of carrier gas flowing into the vaporizer within 70° C. through 140° C.; and to keep a temperature of the gas lines and a source line from the vaporizer to the reaction chamber the same with a temperature of the vaporizer.

Process condition, when said liquid delivery system is a control evaporation mixer, is: to keep a temperature of the control valve of the vaporizer in the control evaporation mixer at a room temperature; to set a temperature of the heat exchanger in the vaporizer to 50° C. through 120° C.; to control a temperature of carrier gas flowing into the control valve within 20° C. through 140° C.; and to keep a temperature of the gas lines and a source line from the vaporizer to the reaction chamber the same with or 5° C. through 20° C. higher than a temperature of the heat exchanger.

Process condition, when the liquid delivery system is a system to have a vaporizer of orifice type or a system with a vaporizer of spray type, is: to set a temperature of the vaporizer to 70° C. through 120° C.; to control a temperature of carrier gas flowing into the vaporizer within 70° C. through 140° C.; and to keep a temperature of the gas line and a source line from the vaporizer to the reaction chamber the same with a temperature of the vaporizer.

Carrier gas may be one of helium (He), hydrogen (H2) and argon (Ar) at least, and flow of the gas is within 100 sccm through 700 sccm.

A wafer is made by forming an inter-layer insulation film on a semiconductor substrate on which many elements are formed for forming a semiconductor device, performing cleaning after forming contact holes and trenches on the inter-layer insulation film, and forming a diffusion barrier on the surface of the inter-layer insulation film to include the contact holes and trenches.

An inter-layer insulation film is formed, using an insulation film of a low dielectric constant, contact holes and trenches are made by dual damascene type plasma is used when the lower layer is metal such as tungsten (W) or aluminum (Al), or reactive cleaning when it is copper (Cu). A diffusion barrier is formed by one of ionized PVD TiN, CVD TiN, MOCVD TiN, ionized PVD Ta, ionized PVD TaN, CVD Ta, CVD TaN, and CVD WN at least.

Inside temperature of the reaction chamber and a temperature of the shower head of the reaction chamber is within 70° C. through 120° C., and a temperature of the susceptor plate of the reaction chamber is within 150° C. through 280° C.

Inside pressure of the reaction chamber is within 0.5 torr through 5 torr, and the interval between the showerhead of the reaction chamber and the susceptor plate of said reaction chamber is within 20 mm through 50 mm.

Flow rate of the (hfac)Cu(VTMOS) precursor is 0.1 sccm through 2.0 sccm, and the (hfac)Cu(VTMOS) precursor may be added at least one of VTMOS of 1% through 30%, Hfac of 0.1% through 10% and Hhfac½$H_2O$ of 0.1% through 10% as an additive.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The above object, and other features and advantages of the present invention will become more apparent by describing the preferred embodiment thereof with reference to the accompanying drawings, in which.

Similar reference characters refer to similar parts in the several views of the drawings.

DETAILED DESCRIPTION OF THE INVENTION

Reference will now be made in detail to the preferred embodiments of the present invention, and examples of which are illustrated in the accompanying drawings.

Figure 1:
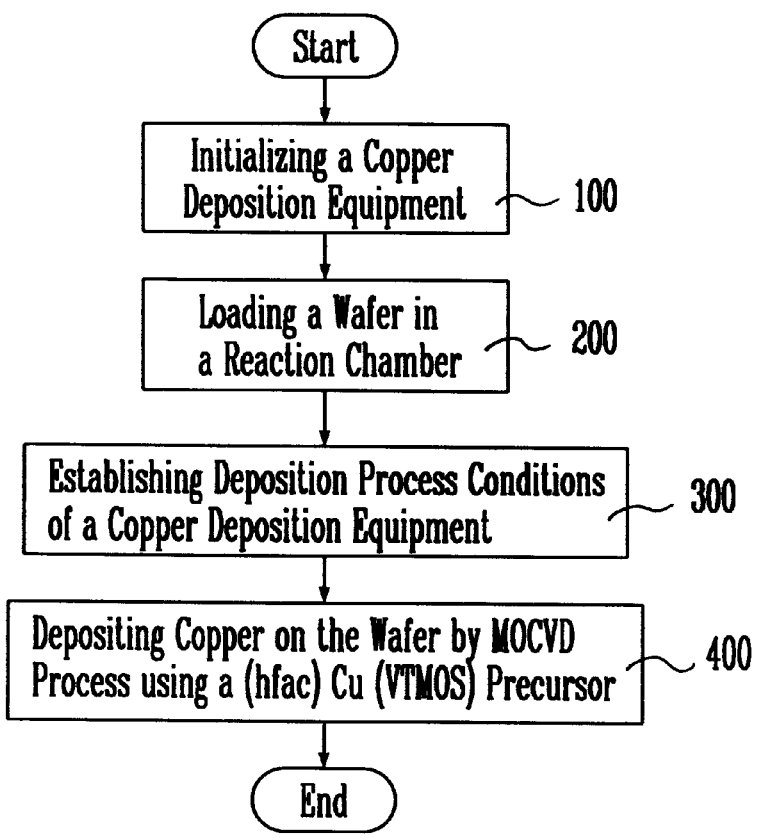
FIG. 1 is a flow chart of a copper deposition process for describing a method of forming a copper wiring in a semiconductor device in accordance with the present invention.

FIG. 1 is a flow chart of a copper deposition process for describing a method of forming a copper wiring in a semiconductor device in accordance with the present invention.

For steps of the process for copper deposition of the present invention, a step 100 of initializing a copper deposition equipment from the start step is executed; a step 200 of loading a wafer for copper deposition to a reaction chamber is executed after the initialization step 100 is completed; a step 300 of establishing deposition process conditions of a copper deposition equipment after the wafer loading step 200 is completed; and a step 400 of depositing copper on the wafer by the MOCVD process using a (hfac)Cu(VTMOS) precursor after the process condition step 300 is competed. Then the copper deposition process is completed.

In said process steps, the step 300 of establishing deposition process conditions for copper deposition equipment is very important process to achieve the purpose of the present invention. Namely, it is because MOCVD process technology using a (hfac)Cu(VTMOS) compound may be realized only when optimum deposition process conditions are set.

To establish optimum deposition process conditions of copper deposition equipment, characteristics of the copper deposition equipment should be verified with characteristics of a (hfac)Cu(VTMOS) compound that is a copper precursor.

Characteristics of the (hfac)Cu(VTMOS) that is a copper precursor is as follows first of all.

The (hfac)Cu(VTMOS) compound with a structural formula of $(C_5HO_2F_6)Cu(C_5H_{12}O_3Si)$ strengthens Cu-L coupling, using the vinyltrimethoxysilane (VTMOS) with the methoxy group of larger electron donation capability as a Lewis base ligand instead of the methyl group of trimethylvinylsilane (TMVS) of the (hfac)Cu(TMVS) compound. As the result, the (hfac)Cu(VTMOS) compound may be stored at a room temperature for long time and shows superior thermal stability. From the aspect of thermal stability, deposition rate of the (hfac)Cu(VTMOS) compound is rather low, but the compound provides the advantage to improve repeatability of process.

A (hfac)Cu(VTMOS) compound begins to decompose at 60° C./$10^{-2}$ torr, is dark chartreuse and liquid at a room temperature. Vapor pressure of the compound is 0.29 torr at 63° C., so that the compound has enough vapor pressure for deposition. Also, the boiling point of VTMOS is 123° C. at 760 torr. Thus, as the theoretical boiling point of VTMOS is around 0° C. if the pressure of the reaction chamber in deposition is 6 torr, it is possible perfectly to evacuate the created VTMOS free ligand.

As described above, a (hfac)Cu(VTMOS) compound has superior characteristics to other compounds used as a copper precursor. However, as the compound may be degraded easily due to characteristics of $Cu^I$ compounds, a (hfac)Cu(VTMOS) compound should be stabilized according to the Le Chaterlier's Principle. Also, perfect surface absorption reaction should be induced in deposition by stabilizing a (hfac)Cu(VTMOS) compound in the process to deliver the source during processing or at the time of deposition in a chamber.

Characteristics of copper deposition equipment are as follows to execute MOCVD using a (hfac)Cu(VTMOS) compound.

Copper deposition equipment used in MOCVD process consists of an LDS and a reaction chamber in general.

The representative LDSes applied to deliver a copper precursor are the DLI produced by "MKS" and the CEM by "Brongkhorst". In addition, there are various LDSes such as an LDS to have a vaporizer of orifice type or spray type.

Figure 2:
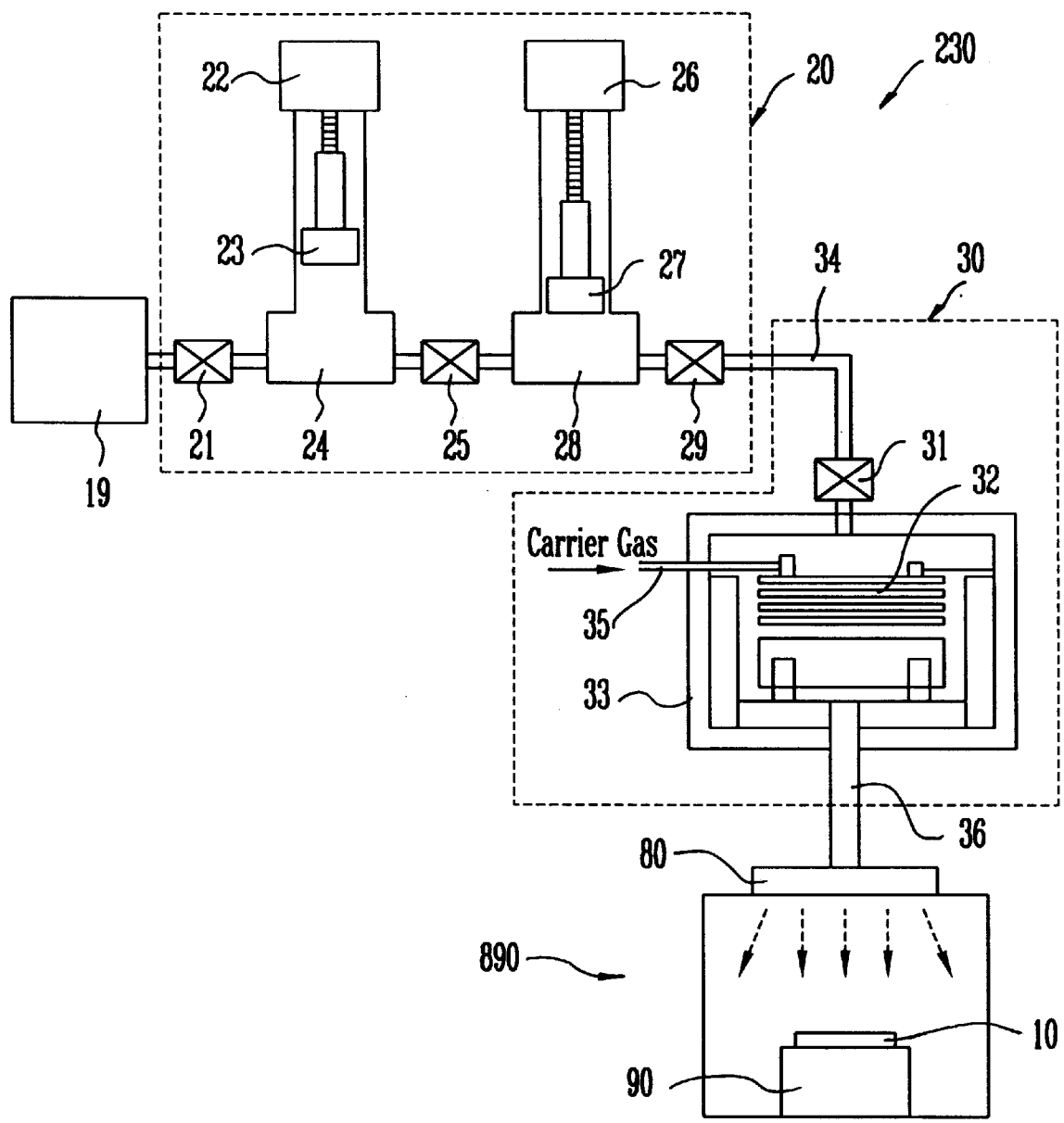
FIG. 2 is a rough configuration of DLI to have a reaction chamber for describing a method of forming a copper wiring in a semiconductor device in accordance with the present invention.

FIG. 2 is a rough configuration of the DLI to have a reaction chamber to describe a method of forming a copper wiring in a semiconductor device in accordance with the present invention.

The DLI 230 consists of a micro pump 20 and a vaporizer 30, and has the structure that liquid material is evaporated in metal disks 32. The liquid material in an ampule 19 is pressurized to about 20 psi and delivered to the micro pump 20 through a first valve 21. Then, while a first piston 23 rises by a first stepping motor 22, the liquid material fills a first cylinder 24. While the action, that a first valve 21 is closed; a second valve 25 opens; the first piston 23 falls; and a second piston 27 rises by a second stepping motor 26, is performed at the same time, the liquid material filled in the first cylinder 24 is delivered to a second cylinder 28 through the second valve 25 and fills the second cylinder 28. While the second valve 25 is closed and a third valve 29 opens, the liquid material is delivered to a vaporizer 30 through the third valve 29 by the fall of the second piston 27. Then, while the first valve 21 opens and the first piston 23 rises, the liquid material fills the first cylinder 24 again. By such repeated action, the liquid material is supplied to the vaporizer 30 through the micro pump 20. Flow control is determined by the number of cycles of the first and the second stepping motor 22 and 26. The liquid material supplied from the micro pump as described above flows into metal disks 32 through the delivery valve 31 equipped in a liquid inflow line 34, and is evaporated by a heating zone 33. The evaporated gas flows into a reaction chamber 890 through an evaporation gas inflow/outflow line 36 with the carrier gas flowing in through a carrier gas inflow line 35.

The reaction chamber 890 comprises a showerhead 80 to spray the evaporated material supplied from the DLI 230, and a susceptor plate 90 to load a wafer 10.

The DLI 230 is constituted to show superior heat exchange efficiency because heat exchange area is very wide since the liquid material flows into metal disks 32 in a vaporizer 30 and is evaporated. As a DLI delivers liquid material flowing in by tens through hundreds psi depending on flow but inside pressure of a vaporizer 30 is kept to be very low within ten torr, a DLI is constituted to maximize evaporation efficiency because volume expansion effect may be achieved depending on pressure difference. The DLI has advantages described above, but it is very difficult to keep constant pressure of liquid material because driving the metal disks 32 depends on the liquid material flowing in and the structure of a DLI is made so that a micro pump 20 may form pressure. Also, very long time (tens of minutes) is taken so that pressure of the liquid material may arrive at the balanced state. The vaporizer 30 may be clogged because much liquid material flows into the metal disks 32 and remains not being evaporated if the liquid material is sucked at the initial state.

Figure 3:
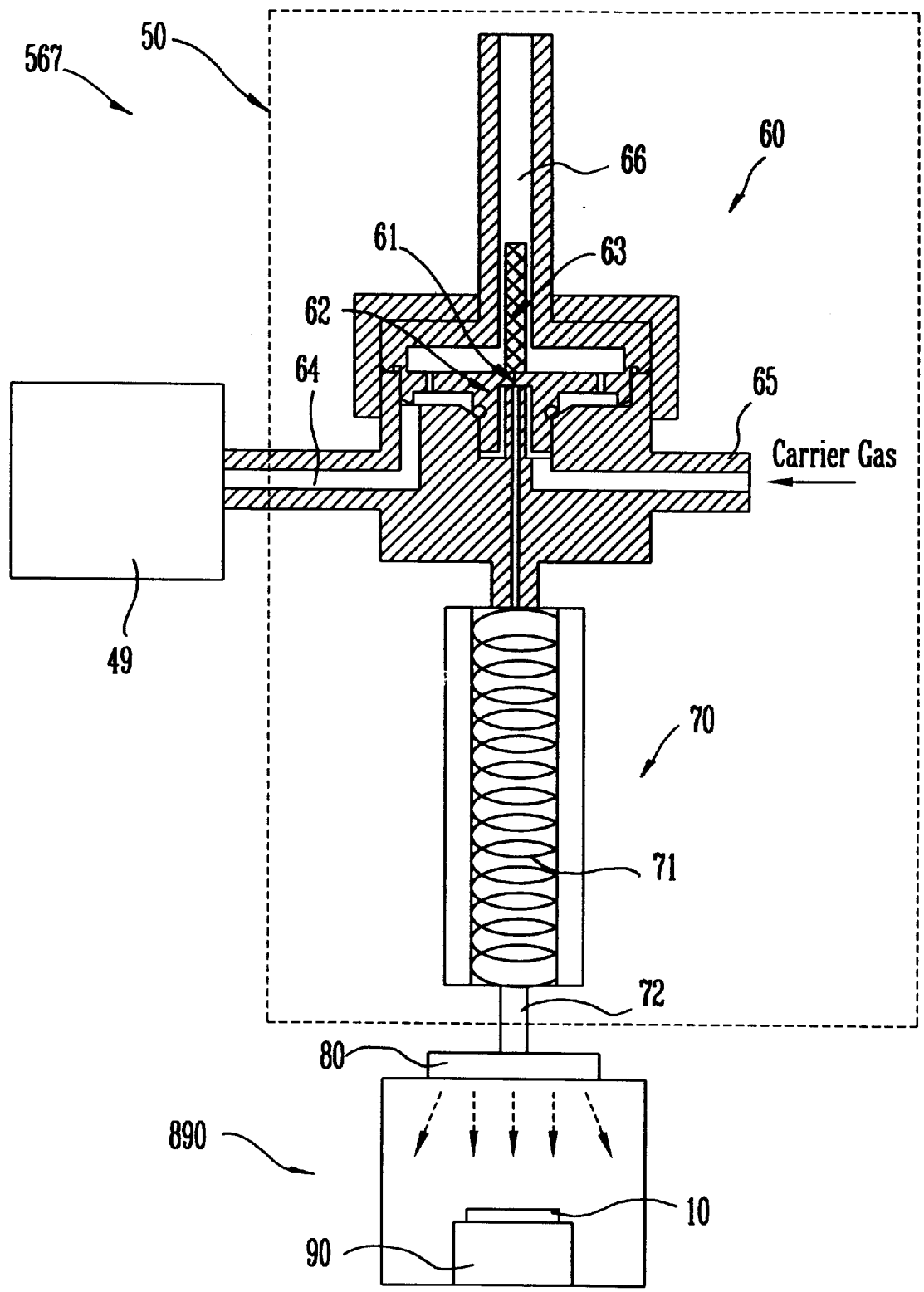
FIG. 3 is a rough configuration of CEM to have a reaction chamber for describing a method of forming a copper wiring in a semiconductor device in accordance with the present invention.

FIG. 3 is a rough configuration of a CEM with a reaction chamber to describe a method of forming a copper wiring in a semiconductor device in accordance with the present invention.

A CEM 567 comprises a Liquid Mass Flow Controller (LMFC) 49 and a vaporizer 50, and has the structure that liquid material is evaporated in a heat exchanger 70. The vaporizer 50 consists of a control valve 60 and a heat exchanger 70. The control valve 60 comprises an orifice 61, a mixer 62 and an actuator 63. The valve 60 also has a liquid inflow line 64 to supply liquid material, a carrier gas inflow line 65 to supply carrier gas and a liquid vent line 66. The heat exchanger 70 has a spiral tube 71.

When carrier gas passes through the mixer 62, the gas forms strong spiral flow and delivers the liquid material passing through the orifice 61 to the heat exchanger 70 by mist type. The liquid material mixed with carrier gas in the mixer 62 is evaporated, passing through the spiral tube 71. The evaporated gas flows into the reaction chamber 890 through the evaporation gas inflow/outflow line 72.

The reaction chamber 890 comprises a showerhead 80 to spray the evaporated material from the CEM 567 and a susceptor plate 90 to load a wafer 10.

The vaporizer 50 of the CEM 567 has rather low probability of orifice 61 clogging because the orifice 61 is not directly heated, but particles are formed by condensation and degradation of liquid material because conductance is very low and evaporation occurs in a long spiral tube 71.

As described above, characteristics of the (hfac)Cu(VTMOS) compound that is a copper precursor begins to degrade at $60°$ C./$10^{-2}$ torr, and vapor pressure of the compound is 0.29 torr at $63°$ C. Also, the boiling point of the VTMOS used as the Lewis base ligand of the (hfac)Cu(VTMOS) compound is $123°$ C. at 760 torr. Therefore, the theoretical boiling point is around $0°$ C. if inside pressure of a reaction chamber is 6 torr at the time of deposition.

The copper deposition process condition for realizing repeatability of the copper deposition process is shown below when copper of the (hfac)Cu(VTMOS) compound with the above characteristics is deposited by MOCVD, using a DLI 230 with a reaction chamber 890.

A temperature of a vaporizer 30 for evaporating the (hfac)Cu(VTMOS) compound that is a copper precursor is within $70°$ C. through $120°$ C. A temperature of carrier gas flowing into the vaporizer 30 should be the same with or a bit higher than a temperature of the vaporizer 30 as $70°$ C. through $140°$ C., so that perfect vaporization of the compound may be allowed. Carrier gas possible to be used then may be one of helium (He), hydrogen ($H_2$) and argon (Ar). Flow of the carrier gas should be 100 sccm through 700 sccm. A temperature of all gas lines and a source line from the vaporizer 30 to the reaction chamber 890 should be kept the same with a temperature of the vaporizer 30 to prevent decomposition and condensation of the (hfac)Cu(VTMOS) compound evaporated in the vaporizer 30 and for better conductance. Inside temperature of the reaction chamber 890 and a temperature of the showerhead 80 should be kept the same with a temperature of the vaporizer 30 so that only pure copper may be deposited on a wafer 10 and impurities may be perfectly evacuated by degrading the evaporated (hfac)Cu(VTMOS) compound flowing into the reaction chamber 890. A temperature of a susceptor plate 90 on which the wafer 10 is loaded should be within 150° C. through 280° C. Inside pressure of the reaction chamber 890 should be kept within 0.5 torr through 5 torr. The interval between a showerhead 80 and a susceptor plate 90 should be 20 mm through 50 mm. Flow rate of the (hfac)Cu(VTMOS) compound that is a copper precursor should be 0.1 sccm through 2.0 sccm. In the above process, the (hfac)Cu(VTMOS) compound may be added at least one of VTMOS of 1% through 30%, Hhfac of 0.1% through 10% and Hhfac½$H_2$O of 0.1% through 10% as an additive.

Also, the copper deposition process condition for realizing repeatability of a copper deposition process is shown below when copper of the (hfac)Cu(VTMOS) compound to have said characteristics is deposited by MOCVD, using a CEM 567 with a reaction chamber 890.

As carrier gas forms strong spiral flow when the gas passes through a mixer 62 in a vaporizer 50 for evaporating the (hfac)Cu(VTMOS) compound that is a copper precursor and the (hfac)Cu(VTMOS) compound through an orifice 61 is delivered to a heat exchanger 70 by mist type, a temperature of the heat exchanger 70 should be lower than or the same with a temperature of the vaporizer 30 of the DLI 230 as 50° C. through 120° C., keeping a temperature of a control valve 60 at a room temperature. By the same reason, a temperature of carrier gas flowing into the control valve 60 of the vaporizer 50 should be within 20° C. through 140° C. that is lower or higher than a temperature of the heat exchanger of the vaporizer 50. Carrier gas to be used then may be one of helium (He), hydrogen ($H_2$) and argon (Ar). Flow of the carrier gas should be within 100 sccm through 700 sccm. A temperature of all gas lines and a source line from the vaporizer 50 to the reaction chamber 890 should be kept the same with or 5° C. through 20° C. higher than a temperature of the heat exchanger 70 of the vaporizer 50 to prevent decomposition and condensation of the (hfac)Cu(VTMOS) compound evaporated in the heat exchanger of the vaporizer 50 and for better conductance. Inside temperature of the reaction chamber 890 and a temperature of the showerhead 80 should be kept the same with a temperature of the heat exchanger 70 of the vaporizer 50 so that only pure copper may be deposited on the wafer 10 by degrading the evaporated (hfac)Cu(VTMOS) compound flowing into the reaction chamber 890, and impurities may be perfectly evacuated. A temperature of a susceptor plate 90 on which a wafer 10 is loaded should be within 150° C. through 280° C. Inside pressure of the reaction chamber 890 should be kept within 0.5 torr through 5 torr. The interval between the showerhead 80 and the susceptor plate 90 should be 20 mm through 50 mm. Flow rate of the (hfac)Cu(VTMOS) compound that is a copper precursor should be within 0.1 sccm through 2.0 sccm. In the above process, the (hfac)Cu(VTMOS) compound may be added at least one of VTMOS of 1% through 30%, Hhfac of 0.1% through 10% and Hhfac½$H_2$O of 0.1% through 10% as an additive.

Figure 4:
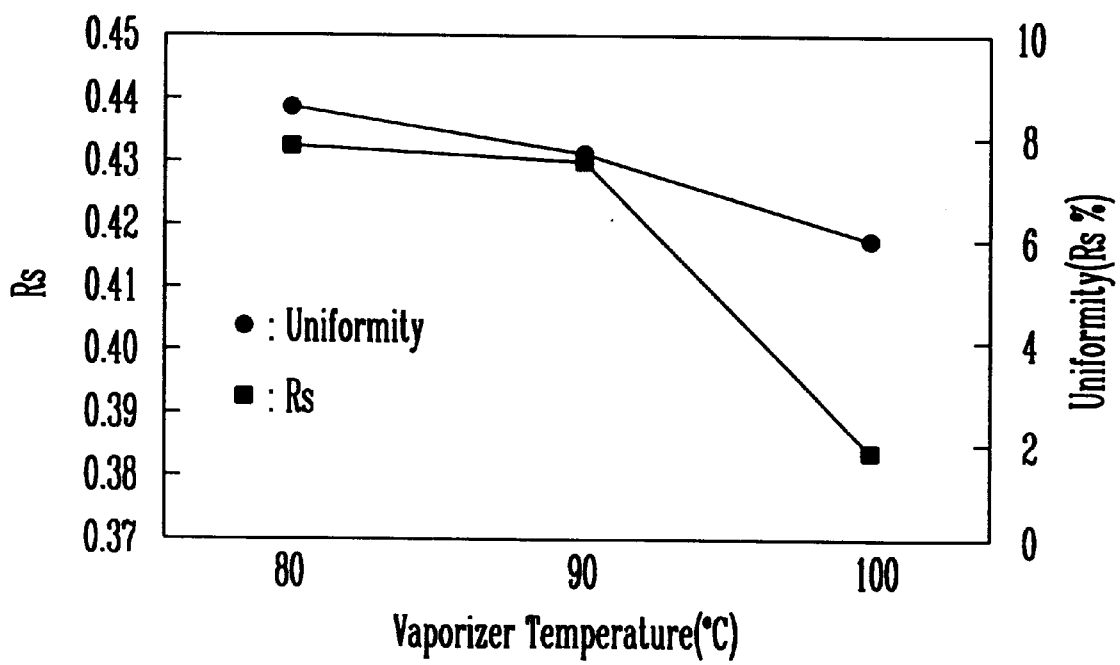
FIG. 4 is a graph to show film quality characteristics of a thin copper film depending on temperature conditions of a vaporizer.

The graph is shown in FIG. 4 to analyze characteristics of film quality of a thin copper film produced by the result of changing a temperature of a vaporizer (a heat exchanger of a vaporizer in case of a CEM) that is a core of copper deposition process, to 80° C., 90° C. and 100° C. at the state keeping a temperature of a reaction chamber and gas lines at proper conditions in forming a thin copper film with said copper deposition process conditions.

As shown in the FIG. 4, resistance (Rs) of a thin copper film is 0.433 $\mu\Omega$cm at 80° C., 0.430 $\mu\Omega$cm at 90° C. and 0.384 $\mu\Omega$cm at 100° C. Uniformity Rs % of a thin copper film is 8.7% at 80° C., 7.5% at 90° C. and 6.0% at 100° C.

A method of forming a copper wiring in a semiconductor device may be described in several ways, on the basis of said copper deposition conditions.

A first method of forming a copper wiring in a semiconductor device of the present invention is described below when copper is deposited for a thin copper film, using the (hfac)Cu(VTMOS) precursor by MOCVD to use a DLI with a reaction chamber as shown in FIG. 2.

This is a method to form an inter-layer insulation film on a semiconductor substrate on which many elements are formed for forming a semiconductor device, to perform cleaning after forming contact holes and trenches on the inter-layer insulation film using a mask, and to form a diffusion barrier on the surface of the inter-layer insulation film to include contact holes and trenches. Then, the method is to deposit copper so that contact holes and trenches may be covered enough, using a (hfac)Cu(VTMOS) precursor by MOCVD in a DLI with a reaction chamber. After the above process, it is to execute Chemical Mechanical Polishing (CMP) and to form a copper wiring after heat processing for hydrogen reduction if copper deposition is completed.

In the above description, an inter-layer insulation film should be an insulation film with a low dielectric constant. Contact holes and trenches should be formed by dual damascene type. RF plasma is used for the cleaning process when the lower layer is metal such as tungsten (W) or aluminum (Al), or reactive cleaning when it is copper (Cu). A diffusion barrier should be formed with one of ionized PVD TiN, CVD TiN, MOCVD TiN, ionized PVD Ta, ionized PVD TaN, CVD Ta, CVD TaN and CVD WN at least. A copper deposition process is executed by: keeping a temperature of a vaporizer 30 of a DLI 230 within 70° C. through 120° C.; controlling a temperature of the carrier gas flowing into the vaporizer 30 to be the same with or a bit higher than a temperature of the vaporizer 30 within 70° C. through 140° C.; selecting used carrier gas from helium (He), hydrogen ($H_2$) or argon (Ar); keeping flow of the carrier gas within 100 sccm through 700 sccm; keeping a temperature of all gas lines and a source line from the vaporizer 30 to the reaction chamber 890 the same with a temperature of the vaporizer 30 to prevent decomposition and condensation of the (hfac)Cu(VTMOS) precursor evaporated in the vaporizer 30 and for better conductance; keeping inside temperature of the reaction chamber 890 and a temperature of the showerhead 80 the same with a temperature of the vaporizer 30; controlling a temperature of the susceptor plate 90 on which a wafer 10 is loaded within 150° C. through 280° C.; keeping inside pressure of the reaction chamber 890 within 0.5 torr through 5 torr; keeping the interval between the showerhead 80 and the susceptor plate 90 within 20 mm through 50 mm; and controlling flow rate of the (hfac)Cu(VTMOS) precursor within 0.1 sccm through 2.0 sccm. In addition, the (hfac)Cu(VTMOS) compound that is the precursor used in the copper deposition process may be added at least one of VTMOS of 1% through 30%, Hhfac of 0.1% through 10% and Hhfac½$H_2$O of 0.1% through 10% as an additive. In heat processing for hydrogen reduction, the grain morphology changes by heat processing for 30 minutes through 3 hours at a room temperature through 350° C. in the hydrogen reduction atmosphere and only hydrogen ($H_2$) or mixed hydrogen gas such as $H_2$+Ar (1–95%) and $H_2$+$N_2$ (1–95%) is applied for hydrogen reduction atmosphere. The cleaning process and the diffusion barrier forming process may be executed without time delay in situ. Also, the copper deposition process and the heat processing for hydrogen reduction may be executed without time delay in situ.

A second method of forming a copper wiring in semiconductor device of the present invention is described below when copper is deposited for a thin copper film, using a (hfac)Cu(VTMOS) precursor by MOCVD to use a CEM with a reaction chamber as shown in FIG. 3.

This is a method to form an inter-layer insulation film on a semiconductor substrate with many elements for forming a semiconductor device, to perform cleaning after forming contact holes and trenches on the inter-layer insulation film using a mask, and to form a diffusion barrier on the surface of the inter-layerinsulation film to include contact holes and trenches. Then, the method is to deposit copper so that contact holes and trenches may be covered enough, using the (hfac)Cu(VTMOS) precursor by MOCVD in a CEM with a reaction chamber. After the above process it is to execute CMP and to form a copper wiring after heat processing for hydrogen reduction if copper deposition is completed.

In the above description, an inter-layer insulation film should be an insulation film with a low dielectric constant. Contact holes and trenches should be formed by dual damascene type. RF plasma is used for the cleaning process when the lower layer is metal such as tungsten (W) or aluminum (Al), or reactive cleaning when it is copper(Cu). A diffusion barrier should be formed with one of ionized PVD TiN, CVD TiN, MOCVD TiN, ionized PVD Ta, ionized PVD TaN, CVD Ta, CVD TaN and CVD WN at least. Copper deposition process is executed by: keeping a temperature of a heat exchanger 70 within 50° C. through 120° C. while keeping a temperature of a control valve 60 in a vaporizer 50 of a CEM 567 at a room temperature; controlling a temperature of the carrier gas flowing into a control valve 60 in a vaporizer 50 to be lower or higher than a temperature of a heat exchanger of the vaporizer within 20° C. through 140° C.; selecting used carrier gas from helium (He), hydrogen ($H_2$) or argon (Ar); keeping flow of the carrier gas within 100 sccm through 700 sccm; keeping a temperature of all gas lines and a source line from the vaporizer 50 to the reaction chamber 890 the same with or 5° C. through 20° C. higher than a temperature of the heat exchanger 70 of the vaporizer 50 to prevent decomposition and condensation of the (hfac)Cu(VTMOS) precursor evaporated in the heat exchanger 70 of the vaporizer 50 and for better conductance; keeping inside temperature of the reaction chamber 890 and a temperature of the showerhead 80 the same with a temperature of the heat exchanger 70 of the vaporizer 50; controlling a temperature of the susceptor plate 90 on which a wafer 10 is loaded within 150° C. through 280° C.; keeping inside pressure of the reaction chamber 890 within 0.5 torr through 5 torr; keeping the interval between a showerhead 80 and a susceptor plate 90 within 20 mm through 50 mm; and controlling flow rate of the (hfac)Cu(VTMOS) precursor within 0.1 sccm through 2.0 sccm. In addition, the (hfac)Cu(VTMOS) compound that is the precursor used in a copper deposition process may be added at least one of VTMOS of 1% through 30%, Hhfac of 0.1% through 10% and Hhfac½$H_2O$ of 0.1% through 10% as an additive. In heat processing for hydrogen reduction, grain morphology changes by heat processing for 30 minutes through 3 hours at a room temperature through 350° C. in the hydrogen reduction atmosphere and only hydrogen ($H_2$) or mixed hydrogen gas such as $H_2$+Ar (1–95%) and $H_2$+$N_2$ (1–95%) is used for the hydrogen reduction atmosphere. Post-cleaning may be executed after CMP. The cleaning process and the diffusion barrier forming process may be executed without time delay in situ. Also, the copper deposition process and the heat processing for hydrogen reduction may be executed without time delay in situ.

A third method of forming a copper wiring in semiconductor device of the present invention is described below when copper is deposited for a thin copper film, using the (hfac)Cu(VTMOS) precursor by MOCVD to use all LDSes with a reaction chamber and a vaporizer of orifice type or spray type.

This is a method to form an inter-layer insulation film on a semiconductor substrate with many elements for forming a semiconductor device, to perform cleaning after forming contact holes and trenches on the inter-layer insulation film using a mask, and to form a diffusion barrier on the surface of the inter-layer insulation film to include contact holes and trenches. Then, the method is to deposit copper so that contact holes and trenches may be covered enough, using the (hfac)Cu(VTMOS) precursor by MOCVD in an LDS to have a reaction chamber and with a vaporizer of orifice type or spray type. After the above process it is to execute CMP and to form a copper wiring after heat processing for hydrogen reduction if copper deposition is completed.

In the above process, for a copper deposition process, an LDS to have a reaction chamber and with a vaporizer of orifice type or spray type is used. The rest detailed description is omitted because it is the same with the process conditions for forming a copper wiring to use a DLI with a reaction chamber as described above.

A fourth method of forming a copper wiring in a semiconductor device of the present invention is described below when copper is deposited for a thin copper film, using the (hfac)Cu(VTMOS) precursor by MOCVD.

This is a method to form an inter-layer insulation film on a semiconductor substrate with many elements for forming a semiconductor device, to perform cleaning after forming contact holes and trenches on the inter-layer insulation film using a mask, and to form a diffusion barrier on the surface of the inter-layer insulation film to include contact holes and trenches. Then, the method is to deposit copper so that contact holes and trenches may be covered enough, using the (hfac)Cu(VTMOS) precursor by MOCVD. After the above process this method is to execute CMP and to form a copper wiring after heat processing for hydrogen reduction if copper deposition is completed.

In the above process, copper deposition process is performed using a vaporizer to evaporate the (hfac)Cu (VTMOS) precursor. The rest detailed description of process conditions for forming a copper wiring is omitted because conditions established in a vaporizer and process conditions for forming a copper wiring are the same with the process conditions for forming a copper wiring to use DLI with a reaction chamber as described above.

A fifth method of forming a copper wiring in a semiconductor device of the present invention is described below when copper is deposited for a Cu seed layer, using the (hfac)Cu(VTMOS) precursor by MOCVD with an in-situ method.

This is a method to form an inter-layer insulation film on a semiconductor substrate on which many elements are formed for forming a semiconductor device, to perform cleaning after forming contact holes and trenches on the inter-layer insulation film using a mask, and to form a diffusion barrier on the surface of the inter-layer insulation film to include contact holes and trenches. Then, this is to deposit a Cu seed layer on the surface of contact holes and trenches, using the (hfac)Cu(VTMOS) precursor by MOCVD with an in-situ method. The method is to deposit copper so that contact holes and trenches on which a Cu seed layer is deposited may be covered enough. After the above process, the method is to execute CMP and to form a copper wiring after heat processing for hydrogen reduction if copper deposition is completed.

In the above process, a DLI, a CEM or a vaporizer of orifice type or spray type is used for a Cu seed layer. Therefore, the rest detailed description is omitted because conditions are the same with the process conditions for forming a copper wiring to use a DLI with a reaction chamber, a copper wiring to use a CEM with a reaction chamber and a copper wiring to use a vaporizer of orifice type or spray type as described above. Other process is also omitted because it is the same with the description as described above.

A sixth method of forming a copper wiring in a semiconductor device of the present invention is described below when copper is deposited for a second Cu seed layer using the (hfac)Cu(VTMOS) precursor by MOCVD after depositing copper for a first Cu seed layer by PVD with an in-situ method, and then copper is deposited for a thin copper film by electroplating.

This is a method to form an inter-layer insulation film on a semiconductor substrate on which many elements are formed for forming a semiconductor device, to perform cleaning after forming contact holes and trenches on the inter-layer insulation film using a mask, and to form a diffusion barrier on the surface of the inter-layer insulation film to include contact holes and trenches. Then, a first Cu seed layer is formed on the surface of contact holes and trenches by PVD with an in-situ method. A second Cu seed layer is deposited on the surface of contact holes and trenches on which a first Cu seed layer is deposited, using the (hfac)Cu(VTMOS) precursor by MOCVD. Then copper is deposited so that contact holes and trenches on which a first Cu seed layer and a second Cu seed layer are formed may be covered enough by electroplating. After the above process this method is to execute CMP and to form a copper wiring after heat processing for hydrogen reduction if copper deposition is completed.

In the above process, a DLI, a CEM or a vaporizer of orifice type or spray type is used for a second Cu seed layer. Therefore, the rest detailed description is omitted because conditions are the same with the process conditions presented for forming a copper wiring to use a DLI with a reaction chamber, a copper wiring to use a CEM with a reaction chamber and a copper wiring to use a vaporizer of orifice type or spray type as described above. Other process is also omitted because it is the same with the description as described above.

A seventh method of forming a copper wiring in a semiconductor device of the present invention is described below when copper is deposited for a Cu seed layer, using the (hfac)Cu(VTMOS) precursor by MOCVD, and then copper is deposited for a thin copper film by PVD.

This is a method to form an inter-layer insulation film on a semiconductor substrate on which many elements are formed for forming a semiconductor device, to perform cleaning after forming contact holes and trenches on the inter-layer insulation film using a mask, and to form a diffusion barrier on the surface of the inter-layer insulation film to include contact holes and trenches. Then, this method is to deposit a Cu seed layer on the surface of contact holes and trenches by MOCVD with an in-situ method, using the (hfac)Cu(VTMOS) precursor. Then this is to deposit copper so that the contact holes and trenches on which a Cu seed layer is deposited may be covered enough by PVD. After the above process this is to execute CMP and to form a copper wiring after heat processing for hydrogen reduction if copper deposition is completed.

In the above process, a DLI, a CEM or a vaporizer of orifice type or spray type is used for a Cu seed layer. Therefore, the rest detailed description is omitted because conditions are the same with the process conditions presented for forming a copper wiring to use a DLI with a reaction chamber, a copper wiring to use a CEM with a reaction chamber and a copper wiring to use a vaporizer of orifice type or spray type as described above. Other process is also omitted because it is the same with the description as described above.

An eighth method of forming a copper wiring in a semiconductor device of the present invention is described below when copper is deposited for a thin copper film, using the (hfac)Cu(VTMOS) precursor by MOCVD.

This is a method to form an inter-layer insulation film on a semiconductor substrate on which many elements are formed for forming a semiconductor device and to perform cleaning after forming contact holes and trenches on the inter-layer insulation film using a mask. This method is to execute plasma treatment after forming a diffusion barrier on the surface of the inter-layer insulation film to include contact holes and trenches. Then, this is to deposit copper on the surface of contact holes and trenches by MOCVD, using the (hfac)Cu(VTMOS) precursor so that copper may be deposited selectively and cover the contact holes and trenches. Then this is to form a copper wiring after heat processing for hydrogen reduction if copper deposition is completed.

In the above process, reaction gas such as helium (He), hydrogen ($H_2$) or argon (Ar) may be used for plasma treatment process, and the process is performed within 100 W through 500 W. A DLI, a CEM or a vaporizer of orifice type or spray type may be used for a selective copper deposition process. Therefore, the rest detailed description is omitted because conditions are the same with the process conditions presented for forming a copper wiring to use a DLI with a reaction chamber, a copper wiring to use a CEM with a reaction chamber and a copper wiring to use a vaporizer of orifice type or spray type as described above. Other process is also omitted because it is the same with the description as described above.

A ninth method of forming a copper wiring in a semiconductor device of the present invention is described below when copper is deposited for a Cu seed layer by MOCVD with an in-situ method, and copper is deposited for a thin copper film by electroless-plating, using the (hfac)Cu(VTMOS) precursor.

This is a method to form an inter-layer insulation film on a semiconductor substrate on which many elements are formed for forming a semiconductor device, to perform cleaning after forming contact holes and trenches on the inter-layer insulation film using a mask, and to form a diffusion barrier on the surface of the inter-layer insulation film to include contact holes and trenches. Then, this method is to deposit a Cu seed layer on the surface of the contact holes and trenches by MOCVD with an in-situ method, using the (hfac)Cu(VTMOS) precursor. Copper is deposited by electroless-plating so that the contact holes and trenches on which the copper seed layer is deposited may be covered enough. Then this method is to execute CMP and to form a copper wiring after heat processing for hydrogen reduction if copper deposition is completed.

In the above process, a DLI, a CEM or a vaporizer of orifice type or spray type is used for a copper seed layer.

Therefore, the rest detailed description is omitted because conditions are the same with the process conditions presented for forming a copper wiring to use a DLI with a reaction chamber, a copper wiring to use a CEM with a reaction chamber and a copper wiring to use a vaporizer of orifice type or spray type as described above. Other process is also omitted because it is the same with the description as described above. On the other hand, post-cleaning may be executed after the electroless-plating process.

A tenth method of forming a copper wiring in a semiconductor device of the present invention is described below when a copper wiring is a multi-level structure.

Copper deposition equipment to comprise a reaction chamber and a delivery system is provided in this method. This is a method to form a first inter-layer insulation film on a semiconductor substrate on which many elements are formed for forming a semiconductor device, to perform cleaning after forming a first contact hole and a first trench on a first inter-layer insulation film, and to load a wafer with a first diffusion barrier on the surface of a first inter-layer insulation film to include a first contact hole and a first trench, to a reaction chamber. This method is to flow the evaporated (hfac)Cu(VTMOS) precursor into the reaction chamber after evaporating the (hfac)Cu(VTMOS) precursor in the liquid delivery system, and to deposit copper on said first contact hole and said first trench on which said first diffusion barrier is deposited by the MOCVD process. Then this is to execute CMP after heat processing for hydrogen reduction, and to form a first copper wiring. This is also to form a second insulation film on a first copper wiring, to perform cleaning after forming a second contact hole and a second trench on said second inter-layer insulation film, and then to load a wafer with a second diffusion barrier on the surface of said second inter-layer insulation film to include said second contact hole and said second trench, to a reaction chamber again. After the above process, this method is to form a second copper wiring by the same process to form a first copper wiring, and to form a copper wiring of a multi-level structure by repeating such process once at least.

All conditions applied to the copper wiring process of a multi-level structure observe conditions as described above for copper deposition of the present invention.

As described above, not only can the present invention realize repeatability of a copper deposition process, but can produce a thin copper film of superior film quality because the present invention can induce perfect surface absorption reaction at the time of copper deposition by establishing MOCVD process technology using the (hfac)Cu(VTMOS) compound as a copper precursor with optimum deposition process conditions of a copper deposition equipment.

While the present invention has been described and illustrated herein with reference to the preferred embodiment thereof, it will be understood by those skilled in the art that various changes in form and details may be made therein without departing from the spirit and scope of the invention.

What is claimed is:

1. A method of forming a copper wiring in a semiconductor device, comprising the steps of:
    providing copper deposition equipment comprising a reaction chamber and a liquid delivery system;
    loading a wafer to said reaction chamber;
    evaporating a (hfac)Cu(VTMOS) precursor in said liquid delivery system;
    flowing said evaporated (hfac)Cu(VTMOS) precursor into said reaction chamber; and
    depositing copper on said wafer by Metal Organic Chemical Vapor Deposition(MOCVD) process;
    wherein said liquid delivery system is a direct liquid injection comprising a vaporizer and a gas line connected to said reaction chamber, in which a temperature of said vaporizer is set to 70° C. through 120° C., a temperature of a carrier gas flowing into said vaporizer is controlled to 70° C. through 140° C., and a temperature of said gas line is maintained to the same with a temperature of said vaporizer.

2. The method of forming a copper wiring in a semiconductor device in claim 1, wherein said carrier gas is one of helium, hydrogen and argon, and flow of said gas is within 100 sccm through 700 sccm.

3. The method of forming a copper wiring in a semiconductor device of claim 1, wherein inside temperature of said reaction chamber and a temperature of a showerhead of said reaction chamber is within 70° C. through 120° C.

4. The method of forming a copper wiring in a semiconductor device of claim 1, wherein a temperature of a susceptor plate of said reaction chamber is within 150° C. through 280° C.

5. The method of forming a copper wiring in a semiconductor device of claim 1, wherein inside pressure of said reaction chamber is within 0.5 torr through 5 torr.

6. The method of forming a copper wiring in a semiconductor device of claim 1, wherein interval between a shower head of said reaction chamber and a susceptor plate of said reaction chamber is within 20 mm through 50 mm.

7. The method of forming a copper wiring in a semiconductor device of claim 1, wherein flow rate of said (hfac)Cu(VTMOS) precursor is within 0.1 sccm through 2.0 sccm.

8. The method of forming a copper wiring in a semiconductor device of claim 1, wherein said (hfac)Cu(VTMOS) precursor is added at least one of VTMOS of 1% through 30%, Hhfac of 0.1% through 10% and Hhfac½$H_2O$ of 0.1% through 10% as an additive.

9. A method of forming a copper wiring in a semiconductor device, comprising the steps of:
    providing copper deposition equipment comprising a reaction chamber and a liquid delivery system;
    forming an inter-layer insulation film on a semiconductor substrate on which many elements are formed for forming a semiconductor device, forming a contact hole and a trench on said inter-layer insulation film, and loading a wafer, when a diffusion barrier is deposited on said surface of said inter-layer insulation film to include said contact hole and said trench, to said reaction chamber;
    evaporating a (hfac)Cu(VTMOS) precursor in said liquid delivery system;
    flowing said evaporated (hfac)Cu(VTMOS) precursor into said reaction chamber,
    depositing copper on said contact hole and said trench on which said diffusion barrier layer is deposited by a MOCVD process; and
    forming a copper wiring by executing CMP;
    wherein said liquid delivery system is a direct liquid injection comprising a vaporizer and a gas line connected to said reaction chamber, in which a temperature of said vaporizer is set to 70° C. through 120° C., a temperature of a carrier gas flowing into said vaporizer is controlled to 70° C. through 140° C., and a temperature of said gas line is maintained to the same with a temperature of said vaporizer.

10. The method of forming a copper wiring in a semiconductor device of claim 9, wherein said carrier gas is one of helium, hydrogen or argon, and flow of said carrier gas is within 100 sccm through 700 sccm.

11. The method of forming a copper wiring in a semiconductor device of claim 9, wherein said contact hole and trench are formed by dual damascene type.

12. The method of forming a copper wiring in a semiconductor device of claim 9, wherein said diffusion barrier is formed at least one of ionized PVD TiN, CVD TiN, MOCVD TiN, ionized PVD Ta, ionized PVD TaN, CVD Ta, CVD TaN and CVD WN.

13. The method of forming a copper wiring in a semiconductor device in claim 9, wherein inside temperature of said reaction chamber and a temperature of a shower head of said reaction chamber is kept within 70° C. through 120° C.

14. The method of forming a copper wiring in a semiconductor device in claim 9, wherein a temperature of a susceptor plate of said reaction chamber is within 150° C. through 280° C.

15. The method of forming a copper wiring in a semiconductor device in claim 9, wherein inside pressure of said reaction chamber is kept within 0.5 torr through 5 torr.

16. The method of forming a copper wiring in a semiconductor device in claim 9, wherein interval between a shower head of said reaction chamber and a susceptor plate of said reaction chamber is within 20 mm through 50 mm.

17. The method of forming a copper wiring in a semiconductor device of claim 9, wherein flow rate of said (hfac)Cu(VTMOS) precursor is kept within 0.1 sccm through 2.0 sccm.

18. The method of forming a copper wiring in a semiconductor device of claim 9, wherein said (hfac)Cu (VTMOS) precursor is added at least one of VTMOS of 1% through 30%, Hhfac of 0.1% through 10% and Hhfac½H$_2$O of 0.1% through 10% as an additive.

19. The method of forming a copper wiring in a semiconductor device of claim 9, wherein post-cleaning is executed after said CMP.

20. The method of forming a copper wiring in a semiconductor device of claim 9, where comprising performing a cleaning process after forming said contact hole and said trench, said cleaning process and diffusion barrier forming process being executed without time delay in situ.

21. The method of forming a copper wiring in a semiconductor device of claim 9, further comprising performing heat processing for hydrogen reduction after depositing said copper, said copper deposition process and said heat processing for hydrogen reduction being executed without time delay in situ.

22. The method of forming a copper wiring in a semiconductor device of claim 21, wherein said heat processing for hydrogen reduction is performed for 30 minutes through 3 hours at a room temperature through 350° C in hydrogen reduction atmosphere.

23. The method of forming a copper wiring in a semiconductor device of claim 22, wherein one of H$_2$, H$_2$+Ar (1–95%) and H$_2$+N$_2$ (1–95%) is used for said hydrogen reduction atmosphere.

24. The method of forming a copper wiring in a semiconductor device of claim 9, wherein said copper deposition process further comprises a step of depositing copper by electroplating so that said contact hole and trench may be covered enough after first depositing a copper seed layer by said MOCVD.

25. The method of forming a copper wiring in a semiconductor device of claim 9, wherein said copper deposition process further comprising steps of:

depositing a first copper seed layer on said surface of said contact holes and trenches on which said diffusion barrier is deposited by PVD with an in-situ method, after forming said diffusion barrier; and depositing copper by electroplating after depositing a second copper seed layer on said surface of said contact holes and trenches on which said first copper seed layer is deposited by said MOCVD so that said contact hole and trench on which said first and second copper seed layers may be covered enough.

26. The method of forming a copper wiring in a semiconductor device of claim 9, wherein said copper deposition process further comprises a step of depositing copper by PVD so that said contact hole and trench may be covered enough, after first depositing a copper seed layer by said MOCVD.

27. The method of forming a copper wiring in a semiconductor device of claim 9, wherein said copper deposition process further comprising a step of depositing copper by electroless-plating so that said contact hole and trench may be covered enough, after first depositing a copper seed layer by said MOCVD.

28. A method of forming a copper wiring in a semiconductor device, comprising the steps of:

providing copper deposition equipment comprising a reaction chamber and a liquid delivery system;

loading a wafer into said reaction chamber;

evaporating a (hfac)Cu(VTMOS) precursor in said liquid delivery system;

flowing said evaporated (hfac)Cu(VTMOS) precursor into said reaction chamber, and depositing copper on said wafer by Metal Organic Chemical Vapor Deposition(MOCVD) process;

wherein said liquid delivery system is a control evaporation mixer comprising a vaporizer having a control valve and a heat exchanger, and a gas line connected to said reaction chamber, in which a temperature of said control valve is maintained at a room temperature, a temperature of said heat exchanger is set to 50° C. through 120° C., a temperature of carrier gas flowing into said control valve is controlled to 20° C. through 140° C., and a temperature of said gas line is maintained to the same with or 5° C. through 20° C. higher than a temperature of said heat exchanger.

29. The method of forming a copper wiring in a semiconductor device according to claim 28, wherein said carrier gas is one of helium, hydrogen and argon, and flow of said gas is within 100 sccm through 700 sccm.

30. The method of forming a copper wiring in a semiconductor device according to claim 28, wherein an inside temperature of said reaction chamber and a temperature of a showerhead of said reaction chamber is within 70° C. through 120° C.

31. The method of forming a copper wiring in a semiconductor device according to claim 28, wherein a temperature of a susceptor plate of said reaction chamber is within 150° C. through 280° C.

32. The method of forming a copper wiring in a semiconductor device according to claim 28, wherein an inside pressure of said reaction chamber is within 0.5 torr through 5 torr.

33. The method of forming a copper wiring in a semiconductor device according to claim 28, wherein a spacing between a shower head of said reaction chamber and a susceptor plate of said reaction chamber is between 20 mm through 50 mm.

34. The method of forming a copper wiring in a semiconductor device according to claim 28, wherein a flow rate of said (hfac)Cu(VTMOS) precursor is within 0.1 sccm through 2.0 sccm.

35. The method of forming a copper wiring in a semiconductor device according to claim 28, wherein said (hfac)Cu(VTMOS) precursor is added at least one of VTMOS of 1% through 30%, Hhfac of 0.1% through 10% and Hhfac½H$_2$O of 0.1% through 10% as an additive.

36. A method of forming a copper wiring in a semiconductor device, comprising the steps of:
   providing copper deposition equipment comprising a reaction chamber and a liquid delivery system;
   loading a wafer into said reaction chamber;
   evaporating a (hfac)Cu(VTMOS) precursor in said liquid delivery system;
   flowing said evaporated (hfac)Cu(VTMOS) precursor into said reaction chamber; and
   depositing copper on said wafer by Metal Organic Chemical Vapor Deposition(MOCVD) process;
   wherein said liquid delivery system is a system with a vaporizer of orifice type or a system with a vaporizer of spray type having a gas line connected to said reaction chamber, in which a temperature of said vaporizer is set to 70° C. through 120° C., a temperature of a carrier gas flowing into said vaporizer is controlled to 70° C. through 140° C., and a temperature of said gas line is maintained to the same with a temperature of said vaporizer.

37. The method of forming a copper wiring in a semiconductor device according to claim 36, wherein said carrier gas is one of helium, hydrogen and argon, and flow of said gas is within 100 sccm through 700 sccm.

38. The method of forming a copper wiring in a semiconductor device according to claim 36, wherein an inside temperature of said reaction chamber and a temperature of a showerhead of said reaction chamber is within 70° C. through 120° C.

39. The method of forming a copper wiring in a semiconductor device according to claim 36, wherein a temperature of a susceptor plate of said reaction chamber is within 150° C. through 280° C.

40. The method of forming a copper wiring in a semiconductor device according to claim 36, wherein an inside pressure of said reaction chamber is within 0.5 torr through 5 torr.

41. The method of forming a copper wiring in a semiconductor device according to claim 36, wherein a spacing between a shower head of said reaction chamber and a susceptor plate of said reaction chamber is between 20 mm trough 50 mm.

42. The method of forming a copper wiring in a semiconductor device according to claim 36, wherein a flow rate of said (hfac)Cu(VTMOS) precursor is within 0.1 sccm through 2.0 sccm.

43. The method of forming a copper wiring in a semiconductor device according to claim 36, wherein said (hfac)Cu(VTMOS) precursor is added at least one of VTMOS of 1% through 30%, Hhfac of 0.1% through 10% and Hhfac½H$_2$O of 0.1% through 10% as an additive.

44. A method of forming a copper wiring in a semiconductor device, comprising the steps of:
   providing copper deposition equipment comprising a reaction chamber and a liquid delivery system;
   forming an inter-layer insulation film on a semiconductor substrate on which many elements are formed for forming a semiconductor device, forming a contact hole and a trench on said inter-layer insulation film, and loading a wafer, when a diffusion barrier is deposited on said surface of said inter-layer insulation film to include said contact hole and said trench, into said reaction chamber;
   evaporating a (hfac)Cu(VTMOS) precursor in said liquid delivery system;
   flowing said evaporated (hfac)Cu(VTMOS) precursor into said reaction chamber;
   depositing copper on said contact hole and said trench on which said diffusion barrier layer is deposited by a MOCVD process; and
   forming a copper wiring by executing CMP;
   wherein said liquid delivery system is a control evaporation mixer comprising a vaporizer having a control valve and a heat exchanger, and a gas line connected to said reaction chamber, in which a temperature of said control valve is maintained at a room temperature, a temperature of said heat exchanger is set to 50° C. through 120° C., a temperature of carrier gas flowing into said control valve is controlled to 20° C. through 140° C., and a temperature of said gas line is maintained to the same with or 5° C. through 20° C. higher than a temperature of said heat exchanger.

45. The method of forming a copper wiring in a semiconductor device according to claim 44, wherein said carrier gas is one of helium, hydrogen or argon, and flow of said carrier gas is within 100 sccm through 700 sccm.

46. The method of forming a copper wiring in a semiconductor device according to claim 44, wherein said contact hole and trench are formed by dual damascene type.

47. The method of forming a copper wiring in a semiconductor device according to claim 44, wherein said diffusion barrier is formed at least one of ionized PVD TiN, CVD TiN, MOCVD TiN, ionized PVD Ta, ionized PVD TaN, CVD Ta, CVD TaN and CVD WN.

48. The method of forming a copper wiring in a semiconductor device in claim 44, wherein an inside temperature of said reaction chamber and a temperature of a shower head of said reaction chamber is kept within 70° C. through 120.

49. The method of forming a copper wiring in a semiconductor device in claim 44, wherein a temperature of a susceptor plate of said reaction chamber is within 150° C. through 280° C.

50. The method of forming a copper wiring in a semiconductor device in claim 44, wherein an inside pressure of said reaction chamber is kept within 0.5 torr through 5 torr.

51. The method of forming a copper wiring in a semiconductor device in claim 44, wherein a spacing between a shower head of said reaction chamber and a susceptor plate of said reaction chamber is between 20 mm through 50 mm.

52. The method of forming a copper wiring in a semiconductor device according to claim 44, wherein a flow rate of said (hfac)Cu(VTMOS) precursor is kept within 0.1 sccm through 2.0 sccm.

53. The method of forming a copper wiring in a semiconductor device according to claim 44, wherein said (hfac)Cu(VTMOS) precursor is added at least one of VTMOS of 1% through 30%, Hhfac of 0.1% through 10% Hhfac½H$_2$O of 0.1% through 10% as an additive.

54. The method of forming a copper wiring in a semiconductor device according to claim 44, wherein post-cleaning is executed after said CMP.

55. The method of forming a copper wiring in a semiconductor device according to claim 44, further comprising a step of performing cleaning process after forming said contact hole and said trench, said cleaning process and diffusion barrier forming process being executed without time delay in situ.

56. The method of forming a copper wiring in a semiconductor device according to claim 44, further comprising a step of performing a heat processing for hydrogen reduction after depositing said copper, said copper deposition process and said heat processing for hydrogen reduction being executed without time delay in situ.

57. The method of forming a copper wiring in a semiconductor device according to claim 44, wherein said heat processing for hydrogen reduction is performed for 30 minutes through 3 hours at room temperature through 350° C. in a hydrogen reduction atmosphere.

58. The method of forming a copper wiring in a semiconductor device according to claim 57, wherein one of $H_2$, $H_2+Ar$ (1–95%) and $H_2+N_2$ (1–95%) is used for said hydrogen reduction atmosphere.

59. The method of forming a copper wiring in a semiconductor device according to claim 44, wherein said copper deposition process further comprises a step of depositing copper by electroplating so that said contact hole and trench may be covered enough after first depositing a copper seed layer by said MOCVD.

60. The method of forming a copper wiring in a semiconductor device according to claim 44, wherein said copper deposition process further comprising steps of:
depositing a first copper seed layer on said surface of said contact holes and trenches on which said diffusion barrier is deposited by PVD with an in-situ method, after forming said diffusion barrier; and
depositing copper by electroplating after depositing a second copper seed layer on said surface of said contact holes and trenches on which said first copper seed layer is deposited by said MOCVD so that said contact hole and trench on which said first and second copper seed layers may be covered enough.

61. The method of forming a copper wiring in a semiconductor device according to claim 44, wherein said copper deposition process further comprises a step of depositing copper by PVD so that said contact hole and trench may be covered enough, after first depositing a copper seed layer by said MOCVD.

62. The method of forming a copper wiring in a semiconductor device according to claim 44, wherein said copper deposition process further comprises a step of depositing copper by electroless-plating so that said contact hole and trench may be covered enough, after first depositing a copper seed layer by said MOCVD.

63. A method of forming a copper wiring in a semiconductor device, comprising the steps of:
providing copper deposition equipment comprising a reaction chamber and a liquid delivery system;
forming an inter-layer insulation film on a semiconductor substrate on which many elements are formed for forming a semiconductor device, forming a contact hole and a trench on said inter-layer insulation film, and loading a wafer, when a diffusion barrier is deposited on said surface of said inter-layer insulation film to include said contact hole and said trench, to said reaction chamber;
evaporating a (hfac)Cu(VTMOS) precursor in said liquid delivery system;
flowing said evaporated (hfac)Cu(VTMOS) precursor into said reaction chamber,
depositing copper on said contact hole and said trench on which said diffusion barrier layer is deposited by a MOCVD process; and
forming a copper wiring by executing CMP;
wherein said liquid delivery system is a system with a vaporizer of orifice type or a system with a vaporizer of spray type having a gas line connected to said reaction chamber, in which a temperature of said vaporizer is set to 70° C. through 120° C., a temperature of a carrier gas flowing into said vaporizer is controlled to 70° C. through 140° C., and a temperature of said gas line is maintained to the same with a temperature of said vaporizer.

64. The method of forming a copper wiring in a semiconductor device according to claim 63, wherein said carrier gas is one of helium, hydrogen or argon, and flow of said carrier gas is within 100 sccm through 700 sccm.

65. The method of forming a copper wiring in a semiconductor device according to claim 63, wherein said contact hole and trench are formed by dual damascene type.

66. The method of forming a copper wiring in a semiconductor device according to claim 63, wherein said diffusion barrier is formed at least one of ionized PVD TiN, CVD TiN, MOCVD TiN, ionized PVD Ta, ionized PVD TaN, CVD Ta, CVD TaN and CVD WN.

67. The method of forming a copper wiring in a semiconductor device in claim 63, wherein an inside temperature of said reaction chamber and a temperature of a shower head of said reaction chamber is kept within 70° C. through 120° C.

68. The method of forming a copper wiring in a semiconductor device in claim 63, wherein a temperature of a susceptor plate of said reaction chamber is within 150° C. through 280° C.

69. The method of forming a copper wiring in a semiconductor device in claim 63, wherein an inside pressure of said reaction chamber is kept within 0.5 torr through 5 torr.

70. The method of forming a copper wiring in a semiconductor device in claim 63, wherein a spacing between a shower head of said reaction chamber and a susceptor plate of said reaction chamber is within 20 mm through 50 mm.

71. The method of forming a copper wiring in a semiconductor device according to claim 63, wherein a flow rate of said (hfac)Cu(VTMOS) precursor is kept within 0.1 sccm through 2.0 sccm.

72. The method of forming a copper wiring in a semiconductor device according to claim 63, wherein said (hfac)Cu(VTMOS) precursor is added at least one of VTMOS of 1% through 30%, Hhfac of 0.1% through 10% and Hhfac½$H_2O$ of 0.1% through 10% as an additive.

73. The method of forming a copper wiring in a semiconductor device according to claim 63, wherein post-cleaning is executed after said CMP.

74. The method of forming a copper wiring in a semiconductor device according to claim 63, further comprising performing a cleaning process after forming said contact hole and said trench, said cleaning process and diffusion barrier forming process being executed without time delay in situ.

75. The method of forming a copper wiring in a semiconductor device according to claim 63, further comprising performing a heat processing for hydrogen reduction after depositing said copper, said copper deposition process and said heat processing for hydrogen reduction being executed without time delay in situ.

76. The method of forming a copper wiring in a semiconductor device according to claim 63, wherein said heat processing for hydrogen reduction is performed for 30 minutes through 3 hours at room temperature through 350° C. in a hydrogen reduction atmosphere.

77. The method of forming a copper wiring in a semiconductor device according to claim 76, wherein one of $H_2$, $H_2+Ar$ (1–95%) and $H_2+N_2$ (1–95%) is used for said hydrogen reduction atmosphere.

78. The method of forming a copper wiring in a semiconductor device according to claim 63, wherein said copper deposition process further comprises a step of depositing copper by electroplating so that said contact hole and trench may be covered enough after first depositing a copper seed layer by said MOCVD.

79. The method of forming a copper wiring in a semiconductor device according to claim 63, wherein said copper deposition process further comprises the steps of:

depositing a first copper seed layer on said surface of said contact holes and trenches on which said diffusion barrier is deposited by PVD with an in-situ method, after forming said diffusion barrier; and depositing copper by electroplating after depositing a second copper seed layer on said surface of said contact holes and trenches on which said first copper seed layer is deposited by said MOCVD so that said contact hole and trench on which said first and second copper seed layers may be covered enough.

80. The method of forming a copper wiring in a semiconductor device according to claim 63, wherein said copper deposition process further comprises a step of depositing copper by PVD so that said contact hole and trench may be covered enough, after first depositing a copper seed layer by said MOCVD.

81. The method of forming a copper wiring in a semiconductor device according to claim 63, wherein said copper deposition process further comprises a step of depositing copper by electroless-plating so that said contact hole and trench may be covered enough, after first depositing a copper seed layer by said MOCVD.

* * * * *